(12) United States Patent
Cho et al.

(10) Patent No.: US 12,235,684 B2
(45) Date of Patent: Feb. 25, 2025

(54) SHIELDING MEMBER AND ELECTRONIC DEVICE INCLUDING THE SAME

(71) Applicant: SAMSUNG ELECTRONICS CO., LTD., Suwon-si (KR)

(72) Inventors: Gyuyeong Cho, Suwon-si (KR); Jaedeok Lim, Suwon-si (KR); Jongsoo Sung, Suwon-si (KR); Gunbae Lim, Suwon-si (KR); Dusun Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 80 days.

(21) Appl. No.: 17/929,599

(22) Filed: Sep. 2, 2022

(65) Prior Publication Data

US 2023/0004193 A1    Jan. 5, 2023

Related U.S. Application Data

(63) Continuation of application No. PCT/KR2022/009456, filed on Jun. 30, 2022.

(30) Foreign Application Priority Data

Jul. 2, 2021  (KR) .......................... 10-2021-0086968

(51) Int. Cl.
  *G06F 1/16*    (2006.01)
  *G06F 3/044*   (2006.01)
  (Continued)

(52) U.S. Cl.
  CPC .......... *G06F 1/1656* (2013.01); *G06F 1/1643* (2013.01); *G06F 3/0442* (2019.05);
  (Continued)

(58) Field of Classification Search
  CPC .... G06F 1/1656; G06F 1/1643; G06F 3/0442; G06F 2203/04107; G06F 3/04162;
  (Continued)

(56) References Cited

U.S. PATENT DOCUMENTS 9,001,088 B2    4/2015  Lee et al.
9,411,474 B2    8/2016  Rauhala et al.
(Continued)

FOREIGN PATENT DOCUMENTS

JP            6487089 B2    3/2019
KR   10-2012-0079598 A     7/2012
(Continued)

OTHER PUBLICATIONS

International Search Report and Written Opinion of the International Searching Authority dated Oct. 11, 2022, in connection with International Application No. PCT/KR2022/009456, 8 pages.
(Continued)

*Primary Examiner* — Abhishek M Rathod
*Assistant Examiner* — Keon Kim

(57) ABSTRACT

An electronic device according to various embodiments disclosed in this document may include: a display panel; a recognition member disposed under the display panel and including a conductive pattern to recognize a signal from a pen input device; a first shielding member disposed under the recognition member; and a second shielding member disposed under the first shielding member and made of a material different than the first shielding member, wherein the second shielding member includes a component region corresponding to at least one electronic component disposed under the second shielding member, and wherein at least a portion of the second shielding member is removed from the component region.

14 Claims, 11 Drawing Sheets

(51) Int. Cl.
    *H05K 1/18*           (2006.01)
    *H05K 9/00*           (2006.01)

(52) U.S. Cl.
    CPC ........... *H05K 1/181* (2013.01); *H05K 9/0075* (2013.01); *H05K 9/0088* (2013.01); *H05K 2201/10128* (2013.01)

(58) Field of Classification Search
    CPC .. G06F 3/03545; H05K 1/181; H05K 9/0075; H05K 9/0088; H05K 2201/10128; H05K 9/0024; H05K 9/0096; H05K 9/0022; H04M 2201/38
    See application file for complete search history.

(56) References Cited

U.S. PATENT DOCUMENTS

| | | | |
|---|---|---|---|
| 10,477,737 B2 * | 11/2019 | Kuk | H05K 3/30 |
| 11,275,404 B2 | 3/2022 | Bae et al. | |
| 2007/0217176 A1 * | 9/2007 | Wang | H05K 9/0032 |
| | | | 361/818 |
| 2010/0033447 A1 | 2/2010 | Horie | |
| 2011/0186324 A1 | 8/2011 | Hur et al. | |
| 2012/0169642 A1 | 7/2012 | Lee | |
| 2013/0016073 A1 | 1/2013 | Lee et al. | |
| 2014/0362505 A1 | 12/2014 | Jang et al. | |
| 2015/0264842 A1 * | 9/2015 | Song | H01L 23/42 |
| | | | 29/840 |
| 2016/0262292 A1 * | 9/2016 | Kuk | H05K 1/0218 |
| 2018/0131087 A1 * | 5/2018 | Kim | H05K 9/0026 |
| 2018/0198310 A1 | 7/2018 | Hwang et al. | |
| 2019/0044391 A1 | 2/2019 | Jang et al. | |
| 2019/0317627 A1 | 10/2019 | Kim et al. | |
| 2020/0068136 A1 * | 2/2020 | Lee | H04N 23/631 |
| 2021/0018246 A1 * | 1/2021 | Mori | H05B 6/80 |

FOREIGN PATENT DOCUMENTS

| | | |
|---|---|---|
| KR | 20130117152 A | 10/2013 |
| KR | 20140030365 A | 3/2014 |
| KR | 101399021 B1 | 5/2014 |
| KR | 101510294 B1 | 4/2015 |
| KR | 101576155 B1 | 12/2015 |
| KR | 20160121868 A | 10/2016 |
| KR | 10-1690500 B1 | 12/2016 |
| KR | 10-1804579 B1 | 12/2017 |
| KR | 20180051173 A | 5/2018 |
| KR | 10-2019-0069365 A | 6/2019 |
| KR | 20190119366 A | 10/2019 |
| KR | 102102548 B1 | 4/2020 |
| KR | 20210073699 A | 6/2021 |

OTHER PUBLICATIONS

Extended European Search Report dated Jul. 16, 2024, in connection with European Patent Application No. 22833678.0, 8 pages.

* cited by examiner

SHIELDING MEMBER AND ELECTRONIC DEVICE INCLUDING THE SAME

CROSS-REFERENCE TO RELATED APPLICATIONS

This application is a bypass continuation of International Application No. PCT/KR2022/009456, filed Jun. 30, 2022, which claims priority to Korean Patent Application No. 10-2021-0086968, filed Jul. 2, 2021, the disclosures of which are herein incorporated by reference in their entirety.

BACKGROUND

1. Field

Various embodiments disclosed in this document relate to a shielding member and an electronic device including the shielding member.

2. Description of Related Art

Electronic devices such as smartphones, tablet PCs, and computers are becoming multifunctional. For example, electronic devices may support various types of pen input devices. Some electronic devices may include a display module having a separate component (e.g., digitizer) for recognizing an input from a pen input device.

Meanwhile, an electromagnetic field may be generated in the pen input device and electronic components constituting the electronic device. An electromagnetic field induced into unintended parts may be a major cause of malfunction of the electronic device. A member for shielding an electromagnetic field may be disposed inside the electronic device.

A digitizer of the electronic device may refer to a device that recognizes a signal of the pen input device applied to the display panel through a resonant frequency transmitted from the pen input device.

The resonant frequency can be changed by capacitance and inductance. When the pen tip of the pen input device is pressed by the display panel, the capacitance increases, and the digitizer may recognize a signal of the pen input device by detecting a resonant frequency change due to the capacitance increase. An increase or decrease of the inductance may change the resonant frequency in the same way as an increase or decrease of the capacitance. Hence, when the inductance of the pen input device increases, the digitizer may detect a change in the resonant frequency due to the change in inductance and recognize that a pen input is present. Owing to this phenomenon, although the pen input device is floating in the air, when the inductance of the pen input device is increased, the digitizer may recognize that a pen input is present. Further, if the inductance is decreased owing to an external magnetic field or an induced current, the digitizer may fail to recognize a pen input.

The shielding member according to various embodiments disclosed in this document may reduce malfunction of the pen input device.

SUMMARY

An electronic device according to various embodiments disclosed in this document may include: a display panel; a recognition member disposed under the display panel and including a conductive pattern to recognize a signal from a pen input device; a first shielding member disposed under the recognition member; and a second shielding member disposed under the first shielding member and made of a material different than the first shielding member, wherein the second shielding member includes a component region corresponding to at least one electronic component disposed under the second shielding member, and wherein at least a portion of the second shielding member is removed from the component region.

An electromagnetic field shielding member according to various embodiments disclosed in this document may include: a first shielding member disposed under a recognition member that is disposed under a display panel and includes a conductive pattern configured to recognize a signal from a pen input device; and a second shielding member disposed under the first shielding member and made of a material different than the first shielding member, wherein the second shielding member includes a component region corresponding to at least one electronic component disposed under the second shielding member and is electrically connected to a printed circuit board, and wherein at least a portion of the second shielding member is removed from the component region.

According to various embodiments disclosed in this document, a structure for reducing a current induced in the electronic device by a magnetic field generated from the pen input device may be presented. As the current induced in the electronic device decreases, a phenomenon of decreasing inductance of the pen input device can be alleviated, and thus malfunction of the pen input device can be reduced.

Before undertaking the detailed description below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory, A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

Figure 1:
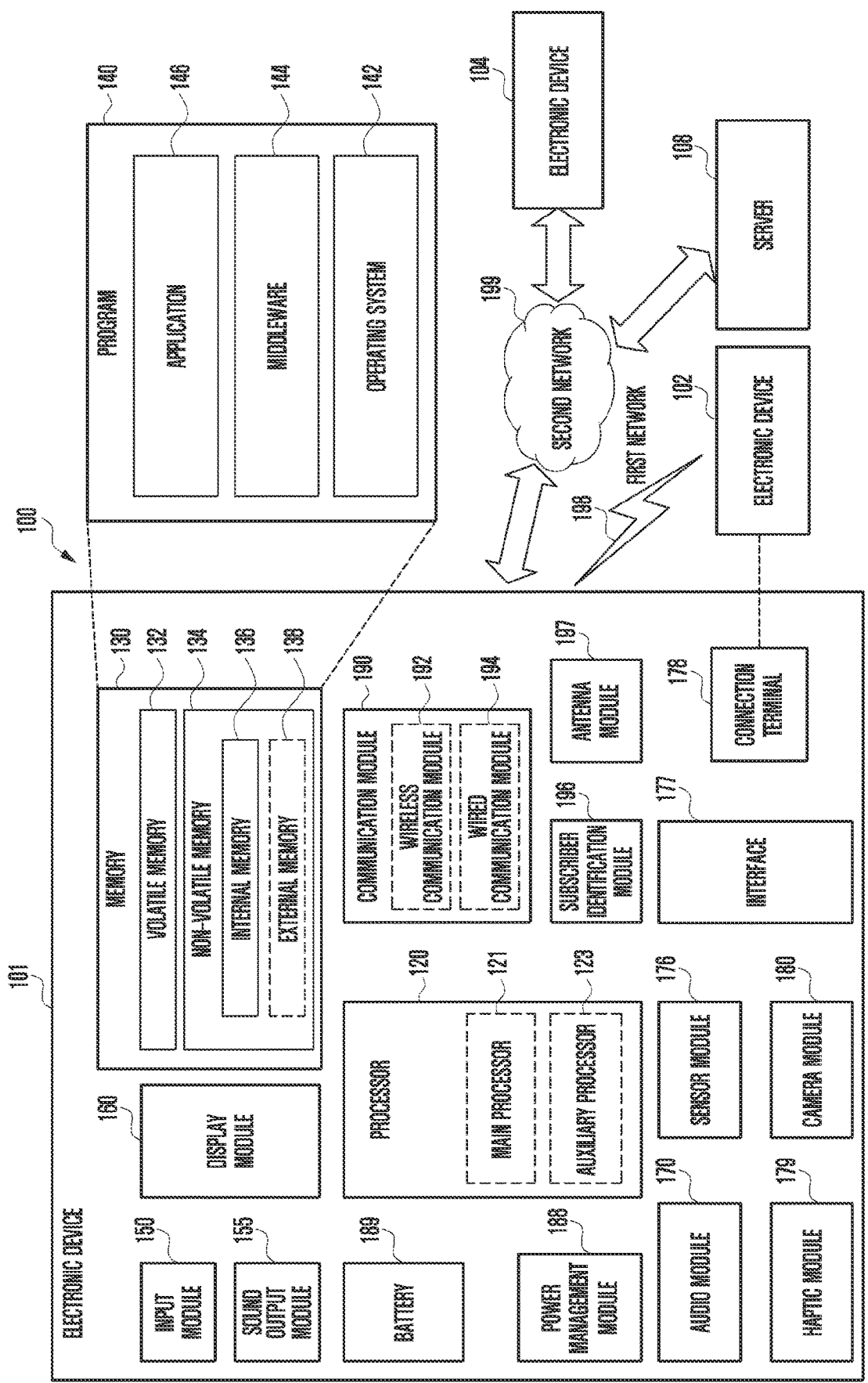
FIG. 1 is a block diagram of an electronic device in a network environment according to various embodiments.

It should be appreciated that various embodiments of the present disclosure and the terms used therein are not intended to limit the technological features set forth herein to particular embodiments and include various changes, equivalents, or replacements for a corresponding embodiment.

With regard to the description of the drawings, similar reference numerals may be used to refer to similar or related elements. It is to be understood that a singular form of a noun corresponding to an item may include one or more of the things, unless the relevant context clearly indicates otherwise.

As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

In this document, the phrase "configured (or set) to" may be used interchangeably with, for example, the phrase "suitable for" "having the capacity to", "designed to", "adapted to", "made to" or "capable of" depending on circumstances. The term "configured (or set) to" does not necessarily mean "specifically designed in hardware to." Rather, in some circumstances, the phrase "device configured to" may mean that the device can perform a specific operation together with other devices or parts. For example, the phrase "processor configured (or set) to perform A, B, and C" may mean a dedicated processor (e.g., embedded processor) for performing the operations or a general-purpose processor (e.g., CPU or application processor) that can perform the operations by executing one or more software programs stored in a memory unit.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g. a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Hereinafter, various embodiments of the present document are described with reference to the accompanying drawings. However, it should be appreciated that the disclosure is not limited to a specific embodiment and all modifications, equivalents, and/or alternatives thereof also belong to the scope of the disclosure. The same or similar reference symbols are used to refer to the same or like portions except where otherwise indicated. Further, descriptions of the same reference numerals may be omitted.

Figure 2:
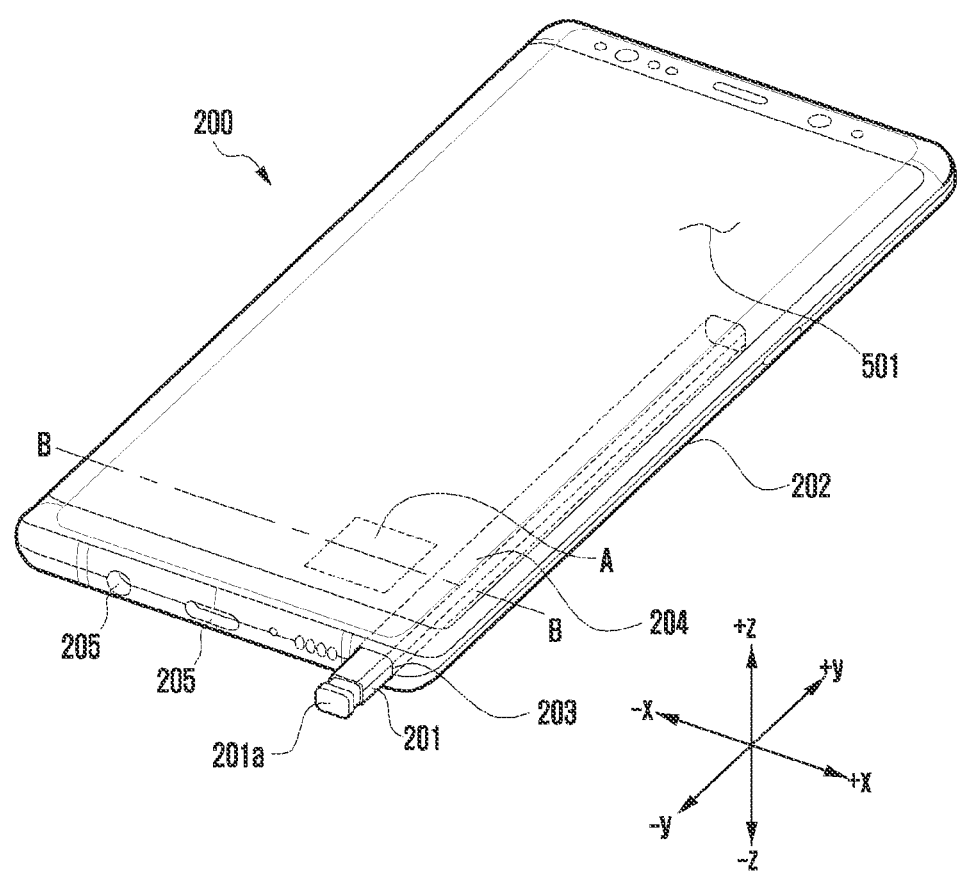
FIG. 2 is a perspective view of the electronic device according to various embodiments disclosed in this document.

FIG. 2 is a perspective view of the electronic device according to various embodiments disclosed in this document.

The electronic device 200 (e.g., electronic device 101 in FIG. 1) according to various embodiments disclosed in this document may include at least one of at least one display module 160, a sound output module 155, a sensor module 176, a camera module 180, an indicator, or a connector port 205, which is disposed in the housing 202. In the electronic device 200, a display panel 501, a support member for supporting the display panel 501, a recognition member 502 electrically connected to the display panel 501 and capable of transmitting and/or receiving a magnetic flux, a first shielding member 503 disposed under the recognition member 502 (e.g., in −Z direction in FIG. 2), a second shielding member 504 disposed under the first shielding member 503 (e.g., in −Z direction in FIG. 2) and made of a material different than the first shielding member 503, and at least one electronic component 506 electrically connected to a second printed circuit board (PCB) 508 may be stacked in this order. Here, the display panel 501, the support member, and the recognition member 502 may be included in the display module 160 in FIG. 1. In certain embodiments, at least one of the above-described components may be omitted from the electronic device 200, or at least one other component may be added to the electronic device 200.

According to various embodiments, an accommodation space 204 for accommodating a pen input device 201 may be formed inside the electronic device 200. The accommodation space 204 may be formed to extend in one direction from an opening 203 formed on one side surface of the electronic device 200. For example, the accommodation space 204 may be formed to extend from the opening 203 in a +Y direction in FIG. 2. The accommodation space 204 may be formed to have a size sufficient to accommodate the pen input device 201. For example, the opening 203 of the entrance to the accommodation space 204 may be larger than the cross-sectional area of the pen input device 201, and the length of the accommodation space 204 (e.g., Y-axis length in FIG. 2) may be greater than or equal to the length of the pen input device 201 (e.g., Y-axis length in FIG. 2).

According to various embodiments, a fixing mechanism connected to the accommodation space 204 for accommodating the pen input device 201 may be disposed inside the electronic device 200. The fixing mechanism may serve to fix the pen input device 201 inside the accommodation space 204. In certain embodiments, at least a part of the fixing mechanism may be connected to the accommodation space 204. In the accommodation space 204, the fixing mechanism may be fastened to a recess formed in a portion of the pen input device 201 to fix the pen input device 201 inside the accommodation space 204.

According to various embodiments, the pen input device 201 may be separated from the electronic device 200 through a button 201a. In certain embodiments, a pressable button 201a may be included at one end of the pen input device 201. When the button 201a is pressed, repulsive components (e.g., spring) associated with the button 201a operate, so that the pen input device 201 may be separated from the accommodation space 204. In certain embodiments, a button 201a having a locking structure may be included so that the user can take out the pen input device 201 by using a fingernail.

Figure 3A:
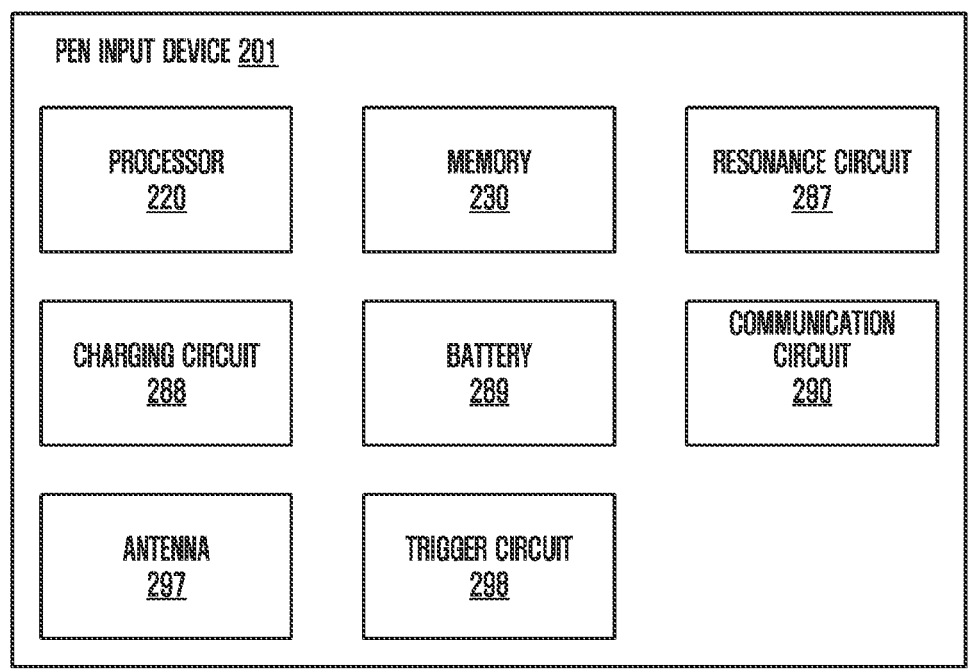
FIG. 3A is a block diagram of a pen input device according to various embodiments.
Figure 3B:
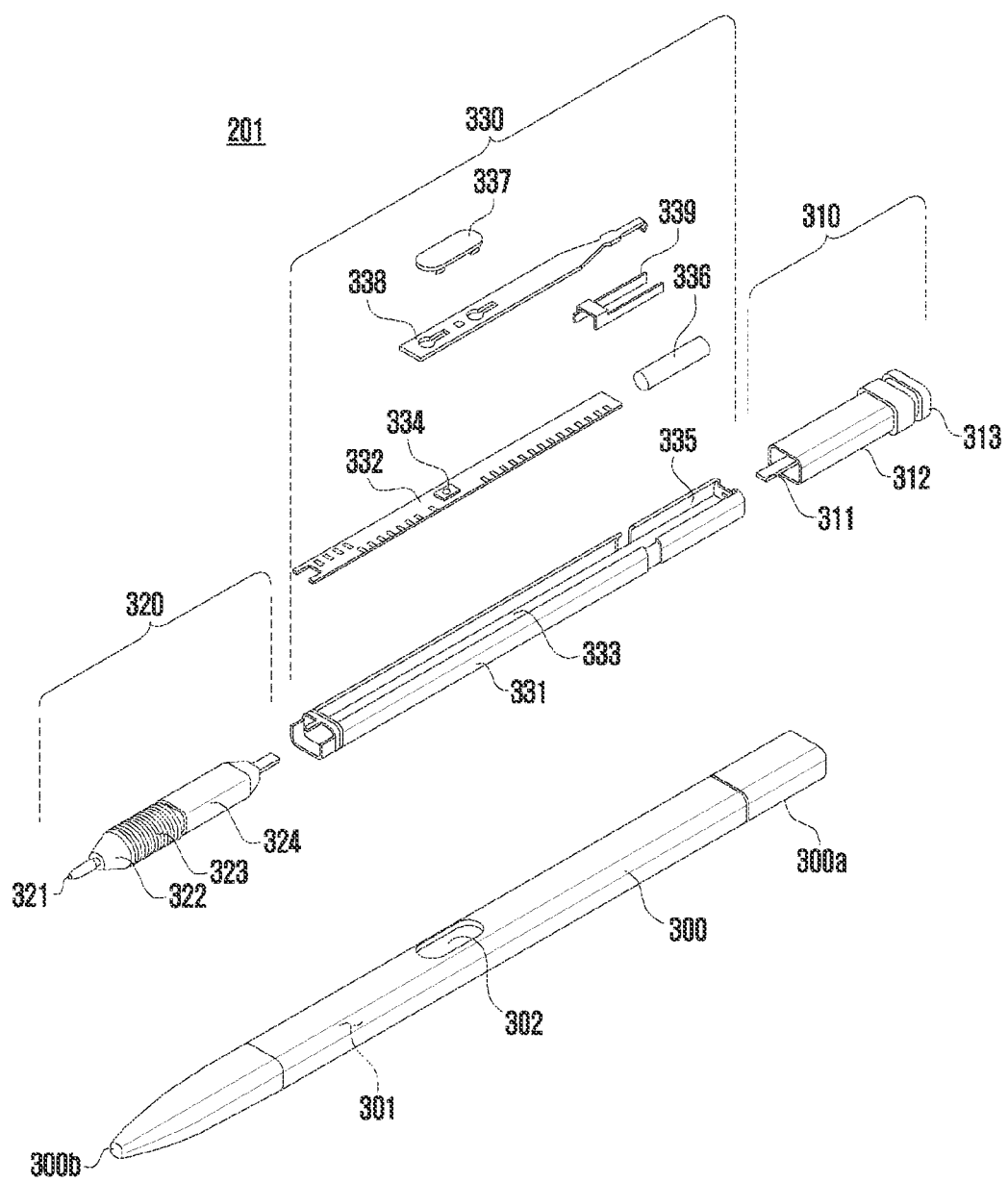
FIG. 3D is an exploded perspective view of the pen input device according to various embodiments.

FIG. 3A is a block diagram of the pen input device according to various embodiments. FIG. 3B is an exploded perspective view of the pen input device according to various embodiments.

With reference to FIG. 3A, the pen input device 201 according to certain embodiments may include a processor 220, a memory 230, a resonance circuit 287, a charging circuit 288, a battery 289, a communication circuit 290, an antenna 297, and/or a trigger circuit 298. In some embodiments, the processor 220 of the pen input device 201, at least a portion of the resonance circuit 287, and/or at least a portion of the communication circuit 290 may be configured on a printed circuit board (e.g., first printed circuit board 332 in FIG. 3B) or in the form of a chip. The processor 220, the resonance circuit 287, and/or the communication circuit 290 may be electrically connected to the memory 230, the charging circuit 288, the battery 289, the antenna 297, or the trigger circuit 298. A pen input device 201 according to certain embodiments may be composed of the resonance circuit 287 and a button only.

The processor 220 may include a generic processor configured to execute a customized hardware module or software (e.g., application program). The processor 220 may include a hardware component (function) or software component (program) including at least one of various sensors equipped in the pen input device 201, a data measurement module, an input/output interface, a module for managing the state or environment of the pen input device 201, or a communication module. The processor 220 may include, for example, hardware, software, firmware, or a combination thereof. According to certain embodiments, the processor 220 may receive, through the resonance circuit 287, a proximity signal corresponding to an electromagnetic field signal generated from the recognition member (e.g., recognition member 502 in FIG. 5A) of the electronic device 200 (e.g., electronic device 101 in FIG. 1). Upon receiving the proximity signal, the processor 220 may control the resonance circuit 287 to transmit an electromagnetic resonance (EMR) input signal to the electronic device 200.

The memory 230 may store information related to the operation of the pen input device 201. For example, the information may include information for communication with the electronic device 200 and frequency information related to an input operation of the pen input device 201.

Figure 4:
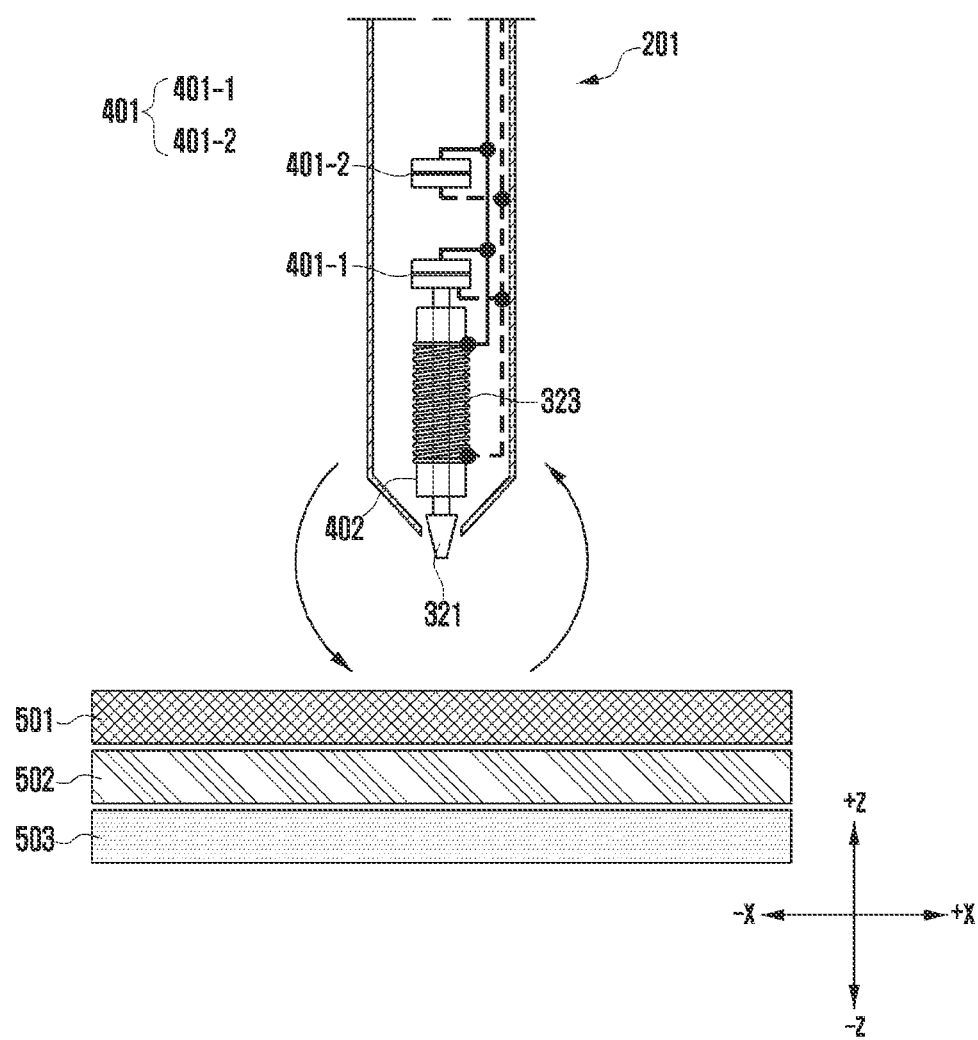
FIG. 4 is an exploded view of the pen input device and a cross-sectional view of the electronic device taken along line B-B in FIG. 2 according to various embodiments disclosed in this document.

The resonance circuit 287 may include at least one of a coil (e.g., coil 323 in FIG. 3B), an inductor, or a capacitor (e.g., capacitor 401 in FIG. 4). The resonance circuit 287 may be used to generate a signal including a resonant frequency of the pen input device 201. For example, to generate the signal, the pen input device 201 may use at least one of an electromagnetic resonance (EMR) method, an active electrostatic (AES) method, or an electrically coupled resonance (ECR) method. When the pen input device 201 transmits a signal using the EMIR method, the pen input device 201 may generate a signal including a resonant frequency based on an electromagnetic field generated from an inductive panel of the electronic device 200. When the pen input device 201 transmits a signal using the AES method, the pen input device 201 may generate a signal by using capacitive coupling with the electronic device 200. When the pen input device 201 transmits a signal using the ECR method, the pen input device 201 may generate a signal including a resonant frequency based on an electric field generated from a capacitive element of the electronic device 200. According to certain embodiments, the resonance circuit 287 may be used to change the strength or frequency of an electromagnetic field according to a user's manipulation state. For example, the resonance circuit 287 may provide a frequency for recognizing a hovering input, a drawing input, a button input, or an erasing input.

When connected to the resonance circuit 287 based on a switching circuit, the charging circuit 288 may rectify the resonance signal generated by the resonance circuit 287 into a DC signal and provide it to the battery 289. According to certain embodiments, the pen input device 201 may check whether the pen input device 201 is inserted into the electronic device 200 by using the voltage level of a DC signal detected by the charging circuit 288.

The battery 289 may be configured to store power required for the operation of the pen input device 201. The battery 289 may include, for example, a lithium-ion battery or a capacitor, and may be rechargeable or replaceable. According to certain embodiments, the battery 289 may be charged using power (e.g., DC signal (DC power)) provided by the charging circuit 288.

The communication circuit 290 may be configured to perform wireless communication between the pen input device 201 and the communication module 190 of the electronic device 200. According to certain embodiments, the communication circuit 290 may transmit state information and input information of the pen input device 201 to the electronic device 200 by using a short-range communication method. For example, the communication circuit 290 may transmit the electronic device 200 direction information (e.g., motion sensor data) of the pen input device 201 obtained through the trigger circuit 298, voice information input through the microphone, or remaining level information of the battery 289. As an example, the short-range communication method may include at least one of Bluetooth, Bluetooth low energy (BLE), or wireless LAN.

The antenna 297 may be used to transmit or receive a signal or power to or from the outside (e.g., electronic device 200). According to certain embodiments, the pen input device 201 may include a plurality of antennas 297 and may select at least one antenna 297 suitable for a communication method from among them. Through the selected at least one antenna 297, the communication circuit 290 may exchange a signal or power with an external electronic device.

The trigger circuit 298 may include at least one button or a sensor circuit. According to certain embodiments, the processor 220 may check the input method (e.g., touch or press) or type (e.g., EMR button or BLE button) of the button of the pen input device 201. According to certain embodiments, the sensor circuit may generate an electrical signal or data value corresponding to an internal operating state or external environmental state of the pen input device 201. For example, the sensor circuit may include at least one of a motion sensor, a remaining battery level sensor, a pressure sensor, an optical sensor, a temperature sensor, a geomagnetic sensor, or a biometric sensor. According to certain embodiments, the trigger circuit 298 may transmit a trigger signal to the electronic device 200 by using an input signal of a button or a signal through a sensor.

With reference to FIG. 3B, the pen input device 201 may include a pen housing 300 constituting the external appearance of the pen input device 201 and an inner assembly inside the pen housing 300. In the illustrated embodiment, the inner assembly includes all the various components mounted inside the pen and may be inserted into the pen housing 300 with one assembly operation.

The pen housing 300 may have an elongated shape between the first end 300a and the second end 300b. The pen housing 300 may have an elliptical cross section including a major axis and a minor axis and may be formed in an elliptical cylinder shape as a whole. The accommodation space 204 of the electronic device 200 may also have an elliptical cross-section corresponding to the shape of the pen housing 300. The pen housing 300 may include a synthetic resin (e.g., plastic) and/or a metallic material (e.g., aluminum). According to certain embodiments, the second end 300b of the pen housing 300 may be made of a synthetic resin material.

The inner assembly may have an elongated shape corresponding to the shape of the pen housing 300. The inner assembly may be largely divided into three constituents along the longitudinal direction. For example, the inner assembly may include an ejection member 310 disposed at a position corresponding to the first end 300a of the pen housing 300, a coil part 320 disposed at a position corresponding to the second end 300b of the pen housing 300, and a circuit board 330 disposed at a position corresponding to the body part of the pen housing 300.

The ejection member 310 may include constituents for withdrawing the pen input device 201 from the accommodation space 204 of the electronic device 200. According to certain embodiments, the ejection member 310 may include a shaft 311, an ejection body 312 disposed around the shaft 311 and forming the overall outer shape of the ejection member 310, and a button 313 (e.g., button 201a in FIG. 2). When the inner assembly is fully inserted into the pen housing 300, the section including the shaft 311 and the ejection body 312 may be surrounded by the first end 300a of the pen housing 300, and the button 313 may be exposed to the outside of the first end 300a. A plurality of components, such as cam members or elastic members, may be disposed inside the ejection body 312 to form a push-pull structure. In certain embodiments, the button 313 may be coupled to the shaft 311 to substantially perform a linear reciprocating motion with respect to the ejection body 312.

According to various embodiments, the button 313 may include a button having a locking structure so that the user can take out the pen input device 201 by using a fingernail. According to certain embodiments, the pen input device 201 may provide another input method by including a sensor that detects a linear reciprocating motion of the shaft 311.

The coil part 320 may include a pen tip 321 exposed to the outside of the second end 300b when the inner assembly is fully inserted into the pen housing 300, a packing ring 322, a multiple wound coil 323, and/or a pen pressure sensor 324 for obtaining a pressure change according to the pressure of the pen tip 321. The packing ring 322 may include epoxy, rubber, urethane, or silicone. The packing ring 322 may be provided for the purpose of waterproofing and dustproofing and may protect the coil part 320 and the circuit board 330 from immersion or dust. According to certain embodiments, the coil 323 may form a resonant frequency in a specified frequency band (e.g., 500 kHz), and may be combined with at least one element (e.g., capacitive element) to adjust the resonant frequency formed by the coil 323 within a preset range.

The circuit board 330 may include a first printed circuit board 332, a base 331 surrounding at least one surface of the first printed circuit board 332, and an antenna 297. According to certain embodiments, a board seating 333, on which the first printed circuit board 332 is to be disposed, may be formed on the upper surface of the base 331, and the first printed circuit board 332 may be fixed while being seated on the board seating 333. According to certain embodiments, the first printed circuit board 332 may include an upper surface and a lower surface, wherein a variable capacitance capacitor 401 or switch 334 connected to the coil 323 may be disposed on the upper surface, and a charging circuit 288, a battery 336 (e.g., battery 289 in FIG. 3A) or a communication circuit may be disposed on the lower surface. The battery may include an electric double layer capacitor (EDLC). The charging circuit 288 is located between the coil 323 and the battery 336 and may include a voltage detector circuit and a rectifier.

The antenna 297 may include an antenna structure 339 as shown in FIG. 3B and/or an antenna embedded in the first printed circuit board 332. According to various embodiments, a switch 334 may be provided on the first printed circuit board 332. A side button 337 provided in the pen input device 201 may be used to press the switch 334 and may be exposed to the outside through a side opening 302 formed in the main body 301 of the pen housing 300. The side button 337 is supported by a support member 338; and if there is no external force acting on the side button 337, the support member 338 may provide an elastic restoring force to restore or maintain the side button 337 to a preset position or in an arrangement state.

The circuit board 330 may include another packing ring such as an O-ring. For example, O-rings made of an elastic material may be disposed at both ends of the base 331 to form a sealing structure between the base 331 and the pen housing 300. In a certain embodiment, the support member 338 may be in close contact with the inner wall of the pen housing 300 around in part the side opening 302 to form a sealing structure. For instance, the circuit board 330 may also form a waterproof and dustproof structure similar to that of the packing ring 322 of the coil part 320.

The pen input device 201 may include a battery seating 335, on which the battery 336 is to be disposed, on the upper surface of the base 331. The battery 336 that may be mounted on the battery seating 335 may include, for example, a cylinder type battery.

The pen input device 201 may include a microphone. The microphone may be connected directly to the first printed circuit board 332 or may be connected to a separate flexible printed circuit board (FPCB) connected to the first printed circuit board 332. According to various embodiments, the microphone may be disposed at a position parallel to the side button 337 in the longitudinal direction of the pen input device 201.

FIG. 4 is an exploded view of the pen input device and a cross-sectional view of the electronic device taken along line B-B in FIG. 2 according to various embodiments disclosed in this document.

According to various embodiments, the pen input device 201 may include a resonance circuit 287. The pen input device 201 may receive, through the resonance circuit 287, a proximity signal corresponding to an electromagnetic field signal generated from the recognition member 502 of the electronic device 200 (e.g., electronic device 101 in FIG. 1).

Upon receiving the proximity signal, the pen input device 201 may control the resonance circuit 287 to transmit an electromagnetic resonance (EMR) input signal to the electronic device 200. Besides, an input signal may be generated by using an active electrostatic (AES) method or an electrically coupled resonance (ECR) method and transmitted to the electronic device 200.

According to various embodiments, the resonance circuit 287 of the pen input device 201 may include at least one of a coil 323, an inductor, or a capacitor 401. Through the resonance circuit 287, the pen input device 201 may generate a signal including a resonant frequency. For example, the pen input device 201 may generate a signal including a resonant frequency by using an EMR method. When the pen input device 201 transmits a signal by the EMIR method, the pen input device 201 may generate a signal including a resonant frequency based on an electromagnetic field generated from an inductive panel of the electronic device 200.

According to various embodiments, the pen input device 201 may include a coil 323 wound multiple times around a ferrite 402 disposed inside the pen input device 201. The coil 323 may form a resonant frequency in a specified frequency band (e.g., 500 kHz), and may be combined with at least one element (e.g., capacitor 401) to adjust the resonant frequency formed by the coil 323 within a preset range.

According to various embodiments, the pen input device 201 may include a plurality of capacitors 401 connected to the pen tip 321. The plurality of capacitors 401 may include a variable capacitor 401-1 and a fixed capacitor 401-2. The capacitance of the plural capacitors 401 may vary according to a change in pressure applied to the pen tip 321. For example, the capacitance of the variable capacitor 401-1 among the plural capacitors 401 may vary according to a change in the interval between plural variable capacitors 401-1 in correspondence to the level of pressure applied to the pen tip 321. In certain embodiments, when the pressure applied to the pen tip 321 increases, the interval between the variable capacitors 401-1 decreases, so that the capacitance may be increased; when the pressure applied to the pen tip 321 decreases, the interval between the plural variable capacitors 401-1 increases, so that the capacitance may be decreased compared to when the pressure applied to the pen tip 321 is increased.

According to various embodiments, the equation for the resonant frequency formed by the pen input device 201 may be defined by $1/2\pi\sqrt{LC}$. Here, L represents an inductance of the coil 323 and C represents a total capacitance where the total capacitance may mean the sum of the capacitance of the variable capacitor 401-1 and the capacitance of the fixed capacitor 401-2. The resonant frequency may vary according to values of inductance and capacitance. Increasing and decreasing the inductance may change the resonant frequency in the same way as the increasing or decreasing the capacitance.

In certain embodiments, increasing or decreasing the inductance may change the resonant frequency in the same way as the increasing or decreasing of the capacitance. Hence, an increase of the inductance of the coil 323 can be recognized as an increase in the total capacitance. In this case, even when the pen input device 201 is floating in the air, the recognition member 502 may recognize a pen input. Conversely, a decrease of the inductance of the coil 323 may not be recognizable by the recognition member 502 as a pen input even when pressure is applied to the pen tip 321 of the pen input device 201. The inductance of the coil 323 may be reduced by an external magnetic field. For example, when a metallic material is present around the coil 323, an induced current is generated in the metallic material by the magnetic field generated by the coil 323, and the induced current may form a magnetic field in a direction to offset the magnetic field generated by the coil 323. Hence, the inductance of the coil 323 may be reduced by an induced current generated in the surrounding metallic material. Various embodiments disclosed in this document may provide a shielding structure that reduces the induced current generated in the electronic device 200 by a magnetic field generated in the coil 323 of the pen input device 201. This will be described in more detail later.

Figure 5A:
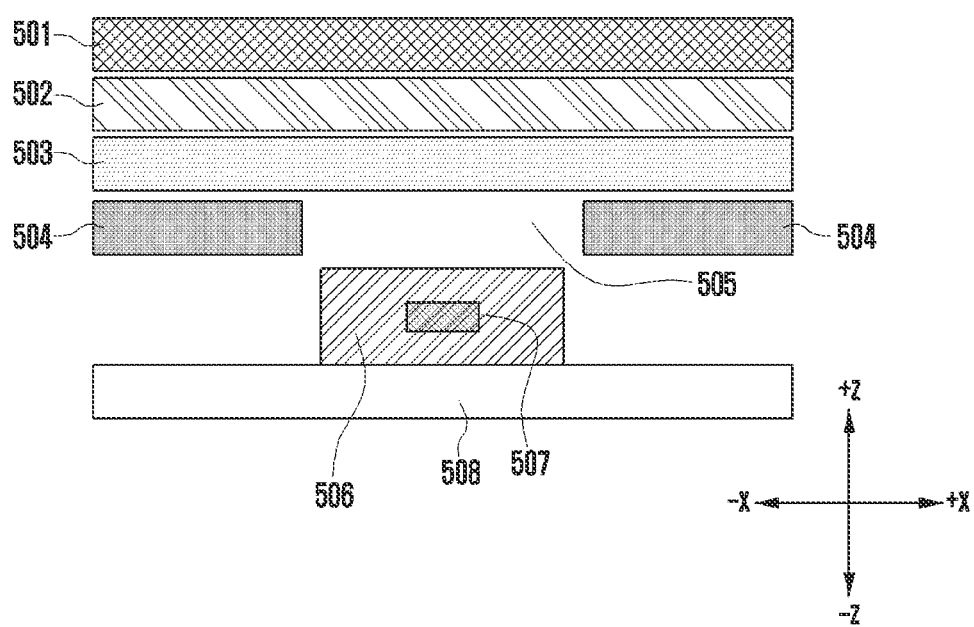
FIG. 5A is a cross-sectional view of the electronic device taken along line B-B in region A of FIG. 2 illustrating a structure in which a display panel, a recognition member, a first shielding member, a second shielding member, and an electronic component are stacked according to various embodiments.
Figure 5B:
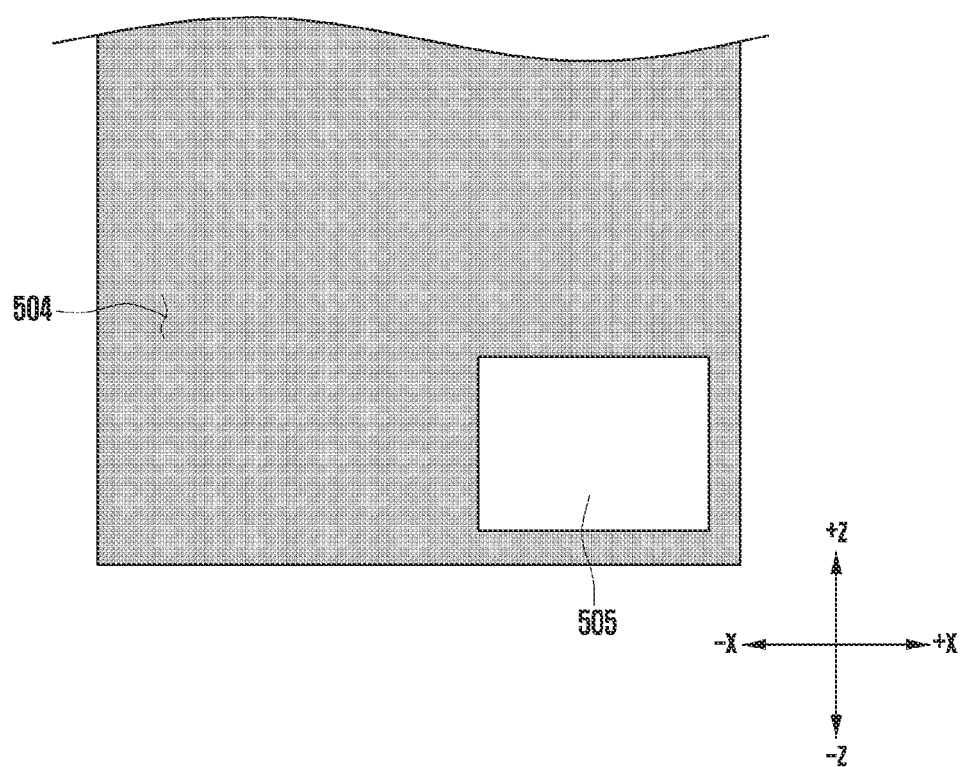
FIG. 5B is an enlarged plan view of a part of the second shielding member in FIG. 5A.
Figure 5C:
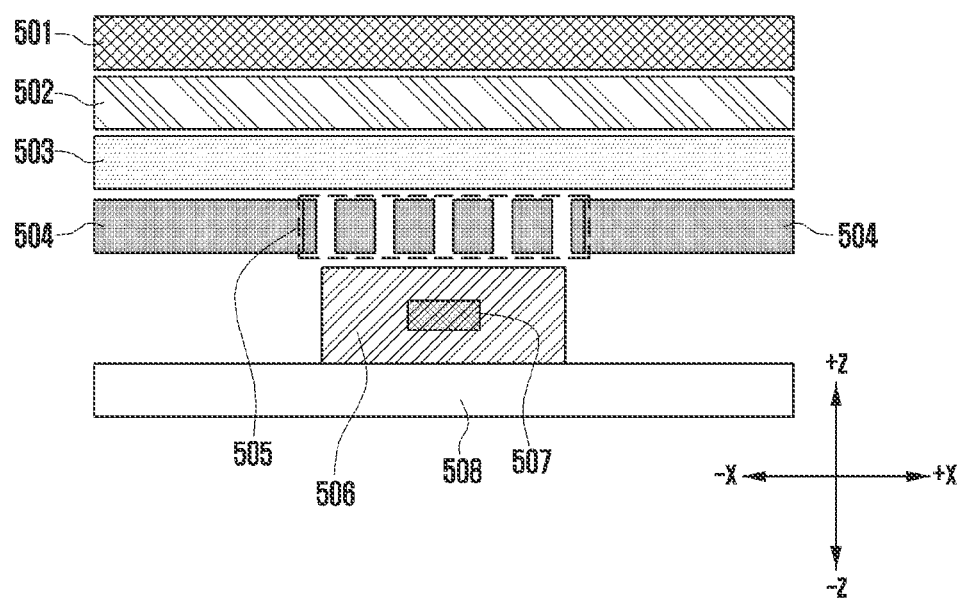
FIG. 5C is a cross-sectional view of the electronic device taken along line B-B in region A of FIG. 2 illustrating a structure in which a display panel, a recognition member, a first shielding member, a second shielding member, and an electronic component are stacked according to another embodiment.
Figure 5D:
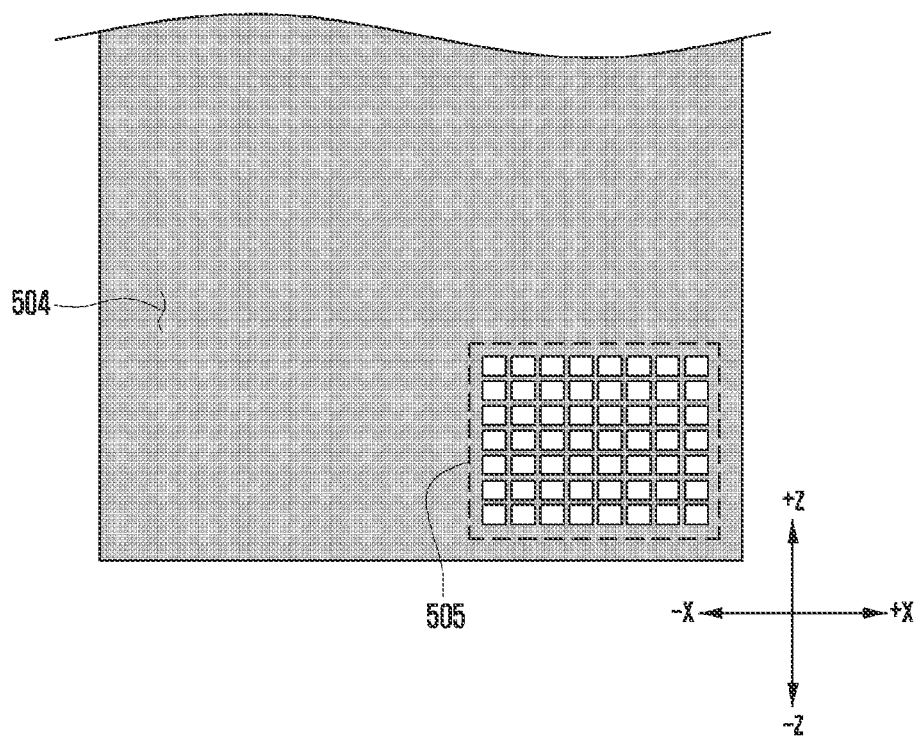
FIG. 5D is an enlarged plan view of a part of the second shielding member in FIG. 5C.
Figure 5E:
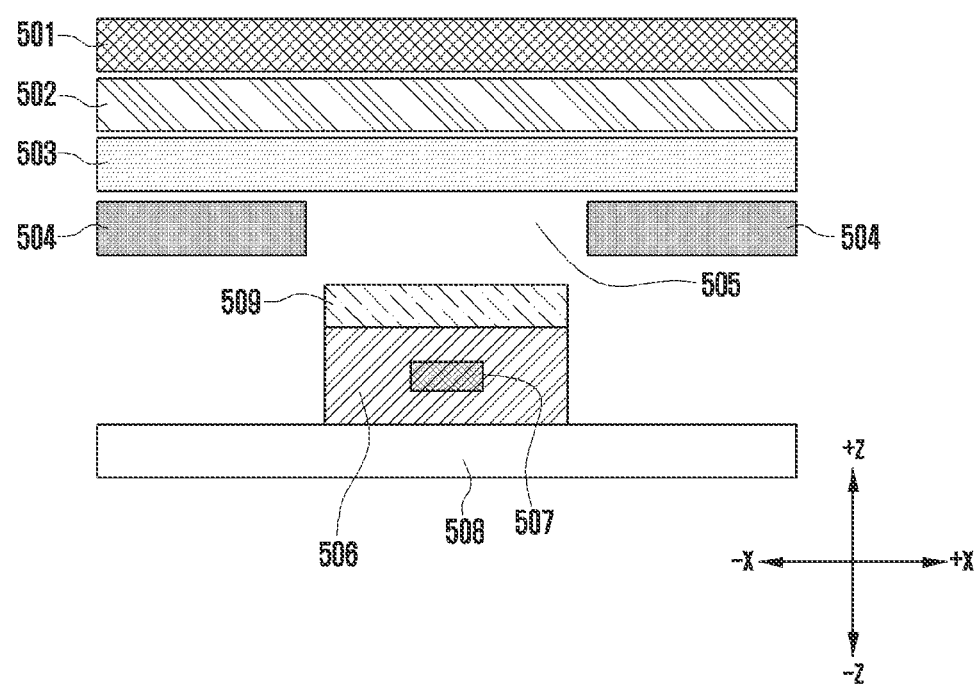
FIG. 5E is a cross-sectional view of the electronic device taken along line B-B in region A of FIG. 2 illustrating a structure in which a display panel, a recognition member, a first shielding member, a second shielding member, and an electronic component are stacked according to another embodiment.

FIG. 5A is a cross-sectional view of the electronic device taken along line B-B in region A of FIG. 2 illustrating a structure in which a display panel, a recognition member, a first shielding member, a second shielding member, and an electronic component are stacked according to various embodiments. FIG. 5B is an enlarged plan view of a part of the second shielding member in FIG. 5A. FIG. 5C is a cross-sectional view of the electronic device taken along line B-B in region A of FIG. 2 illustrating a structure in which a display panel, a recognition member, a first shielding member, a second shielding member, and an electronic component are stacked according to another embodiment. FIG. 5D is an enlarged plan view of a part of the second shielding member in FIG. 5C. FIG. 5E is a cross-sectional view of the electronic device taken along line B-B in region A of FIG. 2 illustrating a structure in which a display panel, a recognition member, a first shielding member, a second shielding member, and an electronic component are stacked according to another embodiment.

According to certain embodiments disclosed in this document, in the electronic device 200 (e.g., electronic device 101 in FIG. 1), a display panel 501, a support member supporting the display panel 501, a recognition member 502 electrically connected to the display panel 501 and capable of transmitting and/or receiving a magnetic flux, a first shielding member 503 disposed under the recognition member 502 (e.g., in −Z direction in FIG. 5A), a second shielding member 504 disposed under the first shielding member 503 (e.g., in −Z direction in FIG. 5A) and made of a material different than the first shielding member 503, and at least one electronic component 506 disposed under the second shielding member 504 (e.g., in −Z direction in FIG. 5A) and electrically connected to the second printed circuit board (PCB 508 may be stacked in this order. Here, the display panel 501, the support member, and the recognition member 502 may be included in the display module 160 in FIG. 1. In certain embodiments, the electronic component 506 may refer to a speaker module (e.g., sound output module 155 in FIG. 1), a microphone module (e.g., sound output module 155 in FIG. 1), a motor, or a camera module (e.g., camera module 180 in FIG. 1), which includes a magnetic material 507 therein, and may also refer to various electronic components including the magnetic material 507. Here, the magnetic material 507 may mean an object having magnetism, such as a magnet. The components from the display panel 501 to the second shielding member 504 may be stacked in various ways. For example, the members may be stacked by using an adhesive member between them. The stacked structure described above is only an example, and another component other than the above-described components may be added or at least one of them may be omitted.

According to various embodiments, the recognition member 502 may be disposed under the display panel 501 (e.g., in −Z direction in FIG. 5A), be electrically connected to the display panel 501, and transmit and/or receive a magnetic field. The recognition member 502 may recognize the pen input device 201 approaching the display panel 501 and generate a signal corresponding to the coordinate value in response to the movement of the pen input device 201 on the display. The recognition member 502 may include a conductive layer for recognizing the movement of the pen input device 201. In certain embodiments, the recognition member 502 may include a digitizer. A magnetic field may be formed in the recognition member 502 by an alternating voltage applied to the conductive layer. As the pen input device 201 embedded with the coil 323 approaches, a current may flow in the internal circuit of the pen input device 201 due to electromagnetic induction to form a resonant frequency, and the recognition member 502 may sense this to recognize the movement of the pen input device 201. The principle of the recognition member 502 recognizing the pen input device 201 described above is merely illustrative, and the recognition member 502 may recognize the movement of the pen input device 201 in various other ways.

According to various embodiments, the first shielding member 503 may be disposed under the recognition member 502 (e.g., in −Z direction in FIG. 5A). The first shielding member 503 may shield the magnetic field generated by the pen input device 201 so that the magnetic field generated by the coil 323 of the pen input device 201 is not induced in metal materials inside the electronic device 200. The first shielding member 503 may be made of a magnetic material having high magnetic permeability to shield a magnetic field. For example, the first shielding member 503 may be made of a soft magnetic material and may be made of a material such as iron (Fe), ferrite, or nano crystal. However, this does not mean that the material forming the first shielding member 503 described above is limited to iron (Fe), ferrite, or nano crystal. The first shielding member 503, as a material capable of shielding a magnetic field, may be modified in various ways within a range that can be easily carried out by a person skilled in the art.

In certain embodiments, the first shielding member 503 may be made of a material having a higher magnetic permeability than other magnetic materials disposed in the electronic device 200. The first shielding member 503 may perform shielding so that an external magnetic field, such as a magnetic field generated by the pen input device 201, is not induced in a metal material in the electronic device 200. In certain embodiments, the first shielding member 503 may shield magnetic fields so that the magnetic field generated by the pen input device 201 is not transmitted to the second shielding member 504. In another embodiment, the first shielding member 503 may shield magnetic fields so that the magnetic field generated by the magnetic material 507 of the electronic component 506 disposed in the electronic device 200 is not transmitted to the pen input device 201.

According to various embodiments, the magnetic permeability of the first shielding member 503 may be reduced by a magnetic field. A magnetic material has a property that the magnetic permeability thereof decreases when an external magnetic field is introduced. In certain embodiments, the magnetic permeability of the first shielding member 503 may be reduced by a magnetic field generated from the magnetic material 507 of the electronic component 506 disposed in the electronic device 200. As a result of the decrease in the magnetic permeability of the first shielding member 503, the shielding ratio of the first shielding member 503 for the magnetic field generated by the coil 323 of the pen input device 201 may be reduced. The closer that the portion of the first shielding member 503 is to the magnetic material 507 of the electronic component 506, the greater the influence of the magnetic field formed by the magnetic material 507 may be. With reference to FIG. 5A, in the first shielding member 503, the region positioned in correspondence to the magnetic material 507 of the electronic component 506 may receive more influence of the magnetic field formed by the magnetic material 507 than other regions, so that its magnetic permeability may be reduced. The density of the magnetic flux of the magnetic field generated by the coil 323 of the pen input device 201 induced through the region of the first shielding member 503 whose magnetic permeability is decreased may increase in the second shielding member 504. As a result, an induced current by a magnetic field generated from the coil 323 of the pen input device 201 may increase in the region of the second shielding member 504 corresponding to the region of the first shielding member 503 whose magnetic permeability is decreased. The induced current generated in the second shielding member 504 may reduce the inductance of the coil 323 embedded in the pen input device 201. As the inductance of the coil 323 decreases, the electronic device 200 may experience a malfunction such as failing to recognize a pen input. An embodiment disclosed in this document may present a structure in which a portion of the second shielding member 504 is removed in order to improve the phenomenon where the inductance of the coil 323 embedded in the pen input device 201 decreases due to an increase in the induced current of the second shielding member 504. This will be described in detail below.

According to various embodiments, as shown in FIGS. 5A and 5B, the second shielding member 504 may be disposed between the first shielding member 503 and the electronic component 506 of the electronic device 200. The second shielding member 504 may include a component region 505. Here, the component region 505 may mean a region of the second shielding member 504 facing the electronic component 506 of the electronic device 200. Further, the component region 505 may correspond to the region of the first shielding member 503 where the magnetic permeability decreases and may be a region in which generation of an induced current by the pen input device 201 increases.

In various embodiments disclosed in this document, a portion of the second shielding member 504 may be removed from the component region 505 of the second shielding member 504. As described above, the generation of an induced current may increase in a region of the second shielding member 504 corresponding to the region of the first shielding member 503 where the magnetic permeability decreases. To remove the region where the generation of an induced current increases, as shown in FIG. 5B, a region corresponding to the region of the first shielding member 503 where the magnetic permeability is lowered by the magnetic material 507 of the electronic component 506, or a region including the region of the first shielding member 503 where the magnetic permeability is lowered may be removed from the component region 505 of the second shielding member 504. Hence, generation of an induced current generated in the second shielding member 504 by the magnetic field formed by the coil 323 of the pen input device 201 can be reduced. Consequently, the phenomenon in which the inductance of the coil 323 of the pen input device 201 decreases is alleviated, and a malfunction in which a pen input is not recognized by the electronic device 200 can be reduced. Hereinafter, in the description related to FIGS. 5A and 5B, the region of the second shielding member 504 is removed from the component region 505 will be referred to as "removed region of the second shielding member".

According to various embodiments, as shown in FIGS. 5C and 5D, the second shielding member 504 may be formed in a mesh shape in the component region 505 (hereinafter, referred to as 'mesh region'). As described above, the mesh region of the second shielding member 504 may be formed in a size corresponding to the region of the first shielding member 503 where the magnetic permeability is lowered by the magnetic material 507 of the electronic component 506, or in a size including the region of the first shielding member 503 where the magnetic permeability is lowered. In this case, compared to the case where the region corresponding to the region of the first shielding member 503 where the magnetic permeability is lowered is not removed from the component region 505, generation of an induced current by the magnetic field generated in the coil 323 of the pen input device 201 can be reduced in the second shielding member 504. As generation of an induced current in the second shielding member 504 decreases, the phenomenon where the inductance of the coil 323 of the pen input device 201 decreases is alleviated, and a malfunction in which a pen input is not recognized by the electronic device 200 can be reduced. In addition, when the second shielding member 504 is formed in a mesh shape in the component region 505, mechanical stability can be increased compared to the case where the second shielding member 504 is completely removed in the component region 505 as shown in FIGS. 5A and 5B.

According to various embodiments, the second shielding member 504 may be disposed to cover the second printed circuit board 508 electrically connected to the electronic component 506 and an electric wire electrically connected to the second printed circuit board 508. With reference to FIG. 5A or 5C, the second shielding member 504 may be disposed so that the remaining region except for the removed region or mesh region of the second shielding member 504 covers, in the component region 505, the second printed circuit board 508 and the wires connected to the second printed circuit board 508. To shield electromagnetic waves generated from the second printed circuit board 508 and wires or to dissipate heat generated inside the electronic device 200, the second shielding member 504 may be made of a conductive material. For example, the second shielding member 504 may be made of a metal material or a material such as graphite. However, this may not mean that the second shielding member 504 is limited to a metal material or graphite. The second shielding member 504 may be variously modified as a material capable of shielding electromagnetic waves within a range that can be easily modified by a person skilled in the art.

According to various embodiments, a plurality of removed regions may be formed in the second shielding member 504. According to certain embodiments, the number of removed regions of the second shielding member 504 may be determined according to the number of electronic components 506 including a magnetic material 507 disposed under the second shielding member 504 (e.g., in −Z direction in FIG. 5A). For example, the number of removed regions of the second shielding member 504 may be the same as the number of electronic components 506 including a magnetic material 507 facing the second shielding member 504. Similarly, a plurality of mesh regions may be formed in the second shielding member 504, and the number of mesh regions may be determined according to the number of electronic components 506 including a magnetic material 507 disposed under the second shielding member 504 (e.g., in −Z direction in FIG. 5A).

According to various embodiments, an insulant may be disposed in the second shielding member 504. In certain embodiments, the insulant may be disposed in the removed region or mesh region of the second shielding member 504 shown in FIGS. 5A to 5D. The insulant may be formed in a size including the removed region or mesh region of the second shielding member 504. The insulant may be disposed to cover the removed region or mesh region of the second shielding member 504 in the front surface (e.g., surface facing in +Z direction in FIG. 5A) or the rear surface (e.g., surface facing in −Z direction in FIG. 5A) of the second shielding member 504. In another embodiment, the insulant may be filled in the removed region or mesh region of the second shielding member 504. As the insulant is disposed or filled in the removed region or mesh region of the second shielding member 504, the second shielding member 504 may have increased mechanical stability with respect to other mechanical objects disposed inside the electronic device 200. An induced current may not be generated in a region of the second shielding member 504 where an insulant is disposed or filled.

According to various embodiments, as shown in FIG. 5E, the electronic component 506 may be covered with a third shielding member 509. In certain embodiments, the third shielding member 509 may be formed to have a size corresponding to the size of the electronic component 506 or a size including the electronic component 506. The third shielding member 509 may be disposed on the front surface of the electronic component 506 (e.g., surface facing in −Z direction in FIG. 5E) to cover the electronic component 506. The third shielding member 509 disposed on the front surface of the electronic component 506 may shield the magnetic field generated by the magnetic material 507 inside the electronic component 506. The third shielding member 509 may be made of a magnetic material having high magnetic permeability to shield a magnetic field. For example, the third shielding member 509 may be made of a soft magnetic material. For example, it may be made of a material such as iron (Fe), ferrite, or nano crystal. In certain embodiments, the third shielding member 509 may be made of the same material as the first shielding member 503. However, this does not mean that the third shielding member 509 described above is limited to iron (Fe), ferrite, or nano crystal. The third shielding member 509, as a material capable of shielding a magnetic field, may be modified in various ways within a range that can be easily carried out by a person skilled in the art.

In another embodiment, the third shielding member 509 may be made of steel plate cold commercial (SPCC). The thickness of the third shielding member 509 may be determined according to the strength of the magnetic field formed by the magnetic material 507 inside the electronic component 506. For example, when the strength of the magnetic field formed by the magnetic material 507 is strong, the third shielding member 509 may be formed to have a thick thickness. Besides, the thickness of the third shielding member 509 may vary depending on the strength of the magnetic field formed by the magnetic material 507 inside the electronic component 506, and may be modified within a range that can be carried out by a person skilled in the art.

Figure 6:
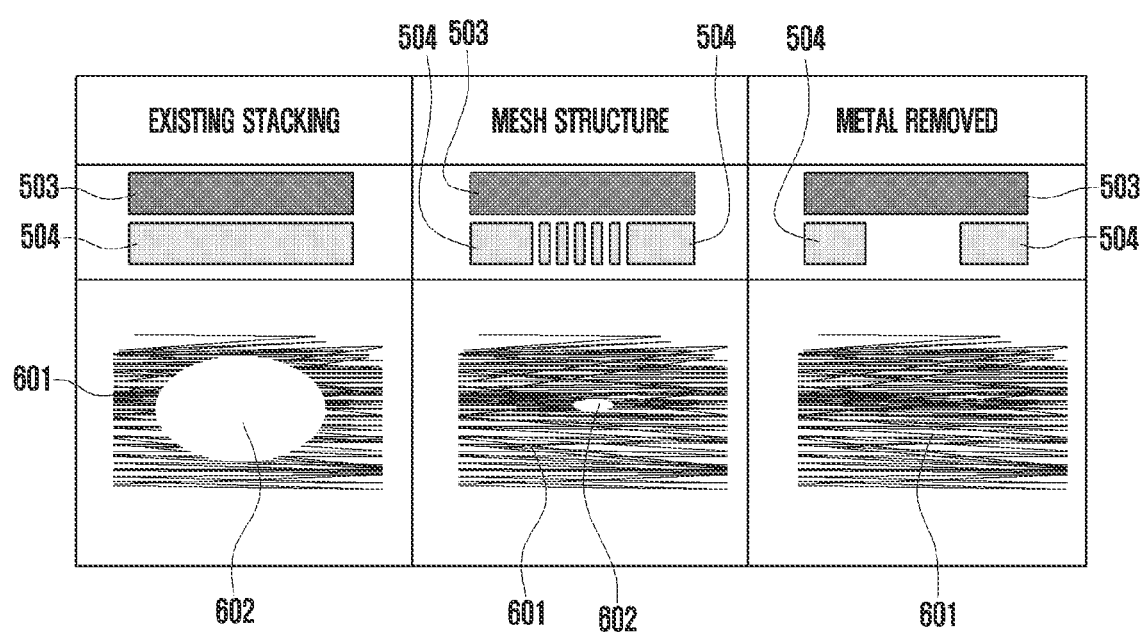
FIG. 6 is a diagram comparing writing performances of the pen input device according to various embodiments disclosed in this document.

FIG. 6 is a diagram comparing writing performances of the pen input device according to various embodiments disclosed in this document.

FIG. 6 is a chart comparing writing performances of the pen input device 201, based on the above description, between a case where no portion of the second shielding member 504 is removed from the component region 505, a case where a portion of the second shielding member 504 is removed from the component region 505, and a case where a portion of the second shielding member 504 is formed in a mesh structure in the component region 505. Here, on the display module 160, the region where writing of the pen input device 201 is possible will be referred to as a pen recognition region 601, and the region where writing is not possible will be referred to as a pen unrecognition region 602. Also, here, the display module 160 may be a concept including the display panel 501, the support member, and the recognition member 502.

According to certain embodiments disclosed in this document, as shown in FIG. 6, when at least a portion of the second shielding member 504 is not removed from the component region 505, as described above, the generation of an induced current may increase in a region of the second shielding member 504 corresponding to the region of the first shielding member 503 where the magnetic permeability decreases. As described above, in the region where the generation of an induced current increases, the inductance of the pen input device 201 may decrease, so that the pen input may fail on the display module 160. With reference to FIG. 6, in certain embodiments, when the region corresponding to the region of the first shielding member 503 where the magnetic permeability decreases or the region including the same is removed from the component region 505 of the second shielding member 504, the pen recognition region 601 may be increased on the display module 160 compared to the case where it is not removed. In another embodiment, when the region corresponding to the region of the first shielding member 503 where the magnetic permeability decreases or the region including the same is formed in a mesh structure in the component region 505 of the second shielding member 504, the pen recognition region 601 may be increased on the display module 160 compared to the case where no portion of the second shielding member 504 is removed from the component region 505. Accordingly, in embodiments disclosed in this document, as a portion of the second shielding member 504 is removed from or formed in a mesh structure in the component region 505, the pen unrecognition region 602 for the pen input device 201 can be reduced.

An electronic device 200 (e.g., electronic device 101 in FIG. 1) according to various embodiments disclosed in this document may include: a display panel 501; a recognition member 502 disposed under the display panel (e.g., in −Z direction in FIG. 5A) and including a conductive pattern to recognize a signal from a pen input device 201; a first shielding member 503 disposed under the recognition member (e.g., in −Z direction in FIG. 5A); and a second shielding member 504 disposed under the first shielding member (e.g., in −Z direction in FIG. 5A) and made of a material different than the first shielding member, wherein the second shielding member may include a component region 505 facing at least one electronic component 506 disposed under the second shielding member (e.g., in −Z direction in FIG. 5A), and at least a portion of the second shielding member may be removed from the component region.

Further, the first shielding member may be made of a material capable of shielding a magnetic field generated by the pen input device so that the magnetic field generated by the pen input device is not transmitted to the second shielding member.

Further, the first shielding member may be made of a soft magnetic material having a higher magnetic permeability than magnetic materials disposed from the display panel to the electronic component, and the second shielding member may be made of a conductive material.

Further, the electronic device may further include a printed circuit board 508 (e.g., second printed circuit board 508 in FIG. 5A) electrically connected to the electronic component, and the second shielding member may be disposed to cover remaining regions on the printed circuit board other than a region corresponding to the component region and may be made of a material capable of shielding electromagnetic waves generated from the printed circuit board.

Further, the electronic component may include a magnetic material 507 therein.

Further, at least a portion of the second shielding member corresponding to the position of the magnetic material inside the electronic component may be removed from the component region.

Further, the portion of the second shielding member removed from the component region may be formed in a mesh structure.

Further, the electronic device may further include an insulation member made of an insulating material and is disposed at the portion of the second shielding member removed from the component region.

Further, the electronic device may further include an insulation member made of an insulating material and is disposed at the mesh structure formed in the component region of the second shielding member.

Further, the electronic device may further include a third shielding member 509 made of a soft magnetic material, and the third shielding member may be disposed under the second shielding member to cover the electronic component.

An electromagnetic field shielding member according to various embodiments disclosed in this document may include: a first shielding member 503 disposed under a recognition member 502 that is disposed under a display panel 501 (e.g., in −Z direction in FIG. 5A) and includes a conductive pattern to recognize a signal from a pen input device 201; and a second shielding member 504 disposed under the first shielding member (e.g., in −Z direction in FIG. 5A) and made of a material different than the first shielding member, wherein the second shielding member may include a component region 505 facing at least one electronic component 506 disposed under the second shielding member (e.g., in −Z direction in FIG. 5A) and is electrically connected to a printed circuit board 508 (e.g., second printed circuit board 508 in FIG. 5A), and at least a portion of the second shielding member may be removed from the component region.

Further, the first shielding member may be made of a material capable of shielding a magnetic field generated by the pen input device so that the magnetic field generated by the pen input device is not transmitted to the second shielding member.

Further, the first shielding member may be made of a soft magnetic material having a higher magnetic permeability than magnetic materials disposed from the display panel to the electronic component, and the second shielding member may be made of a conductive material.

Further, the second shielding member may be disposed to cover remaining regions on the printed circuit board other than a region corresponding to the component region and may be made of a material capable of shielding electromagnetic waves generated from the printed circuit board.

Further, the electronic component may include a magnetic material 507 therein.

Further, at least a portion of the second shielding member corresponding to the position of the magnetic material inside the electronic component may be removed from the component region.

Further, the portion of the second shielding member removed from the component region may be formed in a mesh structure.

Further, the electromagnetic field shielding member may further include an insulation member made of an insulating material and is disposed at the portion of the second shielding member removed from the component region.

Further, the electromagnetic field shielding member may further include an insulation member made of an insulating material and is disposed at the mesh structure in the component region of the second shielding member.

Further, the electromagnetic field shielding member may further include a third shielding member 509 made of a soft magnetic material, and the third shielding member may be disposed under the second shielding member to cover the electronic component.

In addition, the embodiments of the disclosure disclosed in the present specification and drawings are provided as specific examples to easily describe the contents of the disclosure and help understanding, and are not intended to limit the scope of the embodiments disclosed in this document. Therefore, the scope of the embodiments disclosed in this document should be construed to include not only those embodiments disclosed herein but also all changes or modifications derived based on the technical concept of the embodiments disclosed herein.

Although the present disclosure has been described with various embodiments, various changes and modifications may be suggested to one skilled in the art. It is intended that the present disclosure encompass such changes and modifications as fall within the scope of the appended claims.

What is claimed is:

1. An electronic device comprising:
 a display panel;
 a recognition member disposed under the display panel and including a conductive pattern to recognize a signal from a pen input device;
 a first shielding member disposed under the recognition member and including a soft magnetic material to shield a magnetic field generated from the pen input device;
 a second shielding member disposed under the first shielding member and including a conductive material to shield electromagnetic waves generated from an electronic component; and
 a third shielding member disposed under the second shielding member, covering electronic components from a bottom of the second shielding member, and including a soft magnetic material to shield magnetic fields generated from the electronic components,
 wherein the second shielding member includes a component region corresponding to the electronic component, wherein the electronic component is disposed under the second shielding member, and at least one hole formed in the component region; and
 wherein the hole corresponds to a magnetic material disposed inside the electronic component.

2. The electronic device of claim 1, wherein the first shielding member includes the soft magnetic material capable of shielding a magnetic field generated by the pen input device so as to prevent the magnetic field generated by the pen input device from transmitting to the second shielding member.

3. The electronic device of claim 1, wherein
the first shielding member is made of a soft magnetic material having a higher magnetic permeability than magnetic materials disposed from the display panel to the electronic component.

4. The electronic device of claim 1, further comprising a printed circuit board electrically connected to the electronic component,
wherein the second shielding member is disposed to cover remaining regions on the printed circuit board other than a region corresponding to the component region and is made of a material capable of shielding electromagnetic waves generated from the printed circuit board.

5. The electronic device of claim 1, wherein the component region of the second shielding member is formed in a mesh structure.

6. The electronic device of claim 1, further comprising an insulation member made of an insulating material and disposed at the hole of the second shielding member.

7. The electronic device of claim 5, further comprising an insulation member made of an insulating material and disposed at the mesh structure formed in the component region of the second shielding member.

8. An electromagnetic field shielding member comprising:
a first shielding member disposed under a recognition member that is disposed under a display panel and includes a conductive pattern configured to recognize a signal from a pen input device, including a soft magnetic material to shield a magnetic field generated from the pen input device;
a second shielding member disposed under the first shielding member and including a conductive material to shield electromagnetic waves generated from an electronic component; and
a third shielding member disposed under the second shielding member, covering electronic components from a bottom of the second shielding member, and including a soft magnetic material to shield magnetic fields generated from the electronic components,
wherein the second shielding member includes a component region corresponding to the electronic component, wherein the electronic component is disposed under the second shielding member and at least one hole formed in the component region, and
wherein the hole corresponds to a magnetic material disposed inside the electronic component.

9. The electromagnetic field shielding member of claim 8, wherein the first shielding member includes the soft magnetic material capable of shielding a magnetic field generated by the pen input device so as to prevent the magnetic field generated by the pen input device from transmitting to the second shielding member.

10. The electromagnetic field shielding member of claim 8, wherein
the first shielding member is made of a soft magnetic material having a higher magnetic permeability than magnetic materials disposed from the display panel to the electronic component.

11. The electromagnetic field shielding member of claim 8, wherein the second shielding member is disposed to cover remaining regions on a printed circuit board other than a region corresponding to the component region and is made of a material capable of shielding electromagnetic waves generated from the printed circuit board.

12. The electromagnetic field shielding member of claim 8, wherein the component region of the second shielding member is formed in a mesh structure.

13. The electromagnetic field shielding member of claim 8, further comprising an insulation member made of an insulating material and disposed at the hole of the second shielding member.

14. The electromagnetic field shielding member of claim 12, further comprising an insulation member made of an insulating material and disposed at the mesh structure in the component region of the second shielding member.

* * * * *